United States Patent
Kim et al.

(10) Patent No.: US 7,009,203 B2
(45) Date of Patent: Mar. 7, 2006

(54) ORGANIC EL DEVICE AND METHOD FOR MANUFACTURING THE SAME

(75) Inventors: Hye-Dong Kim, Seongnam (KR); Jung Hyun Kwon, Suwon (KR)

(73) Assignee: Samsung SOI Co., Ltd., Suwon (KR)

( * ) Notice: Subject to any disclaimer, the term of this patent is extended or adjusted under 35 U.S.C. 154(b) by 0 days.

(21) Appl. No.: 10/865,990

(22) Filed: Jun. 14, 2004

(65) Prior Publication Data

US 2004/0238824 A1 Dec. 2, 2004

Related U.S. Application Data

(63) Continuation-in-part of application No. 09/991,973, filed on Nov. 26, 2001, now Pat. No. 6,911,670.

(30) Foreign Application Priority Data

Dec. 14, 2000 (KR) ............................... 2000-76528

(51) Int. Cl.
*H01L 29/04* (2006.01)
(52) U.S. Cl. ........................... 257/59; 257/72; 313/505
(58) Field of Classification Search ................. 257/59, 257/72, 347, 350; 313/500, 505
See application file for complete search history.

(56) References Cited

U.S. PATENT DOCUMENTS

| | | | |
|---|---|---|---|
| 5,177,577 A | 1/1993 | Taniguchi et al. ............. 257/59 |
| 5,856,858 A | 1/1999 | Carey et al. ................. 349/158 |
| 5,929,474 A | 7/1999 | Huang et al. ................ 257/292 |
| 5,952,037 A * | 9/1999 | Nagayama et al. ............ 427/66 |
| 6,046,547 A | 4/2000 | Nishio et al. ............. 315/169.3 |
| 6,091,194 A | 7/2000 | Swirbel et al. .............. 313/498 |
| 6,091,196 A | 7/2000 | Codama ...................... 313/504 |
| 6,114,183 A | 9/2000 | Hamada et al. ................ 438/29 |
| 6,175,345 B1 | 1/2001 | Kuribayashi et al. ......... 345/76 |
| 6,215,244 B1 | 4/2001 | Kuribayashi et al. ....... 313/505 |
| 6,384,427 B1 | 5/2002 | Yamazaki et al. ............ 257/59 |
| 6,424,326 B1 | 7/2002 | Yamazaki et al. ............ 345/77 |
| 6,433,487 B1 | 8/2002 | Yamazaki .................... 315/169 |
| 6,501,525 B1 | 12/2002 | Huang et al. ................ 349/150 |
| 6,512,504 B1 * | 1/2003 | Yamauchi et al. ............ 345/87 |
| 6,614,174 B1 | 9/2003 | Urabe et al. ................. 313/504 |
| 2001/0011868 A1 | 8/2001 | Fukunaga et al. .......... 313/506 |
| 2001/0043046 A1 | 11/2001 | Fukunaga .................... 315/160 |
| 2003/0052869 A1 | 3/2003 | Fuji et al. .................... 345/204 |
| 2003/0171060 A1 | 9/2003 | Hirano et al. ................. 445/24 |
| 2004/0014251 A1 | 1/2004 | Park et al. .................... 438/22 |
| 2004/0036410 A1 | 2/2004 | Park et al. .................. 313/504 |

FOREIGN PATENT DOCUMENTS

| | | |
|---|---|---|
| EP | 1124261 | 8/2001 |
| JP | 8-54836 | 2/1996 |
| JP | 10-68955 | 3/1998 |
| JP | 10-189252 | 7/1998 |

(Continued)

*Primary Examiner*—Minh-Loan Tran
(74) *Attorney, Agent, or Firm*—H. C. Park & Associates, PLC

(57) ABSTRACT

An organic EL device includes a thin film transistor (TFT) array substrate including a first insulating substrate, a TFT formed on the first insulating substrate and a capacitor. It also includes an organic EL substrate including a second insulating substrate, and a transparent electrode, an organic EL layer and a metal electrode, which are sequentially stacked on the second insulating substrate. The TFT is coupled to the metal electrode.

18 Claims, 16 Drawing Sheets

FOREIGN PATENT DOCUMENTS

| | | |
|---|---|---|
| JP | 11-3048 | 1/1999 |
| JP | 11-8065 | 1/1999 |
| JP | 11-24604 | 1/1999 |
| JP | 11-101992 | 4/1999 |

* cited by examiner

ORGANIC EL DEVICE AND METHOD FOR MANUFACTURING THE SAME

This is a continuation-in-part to U.S. application Ser. No. 09/991,973, which was filed Nov. 26, 2001 now U.S. Pat. No. 6,911,670.

BACKGROUND OF THE INVENTION

1. Field of the Invention

The present invention relates to an organic EL device and a method for manufacturing the same.

2. Description of Related Art

Recently, in organic EL devices, active matrix organic light emitting diodes (AM-OLED) that can individually control respective pixels are widely used. Each of the pixels typically includes a first thin film transistor (TFT) and a second TFT formed on a transparent substrate, a transparent lower electrode electrically connected to a storage capacitor and a drain electrode of the second TFT, an organic EL region formed on the lower electrode to emit light having a predetermined wavelength, and an opaque upper electrode formed of a material such as aluminum over the whole surface of the transparent substrate.

At this point, let us define the AM-OLED that emits light through a back surface of the organic EL region due to the opaque upper electrode as a "back surface emitting AM-OLED." A surface through which light emits is defined as a "back surface" and a surface through which light does not emit is defined as a "front surface."

Meanwhile, in the back surface emitting AM-OLED, the pixel area is mostly occupied by the first and second TFT and the storage capacitor. Therefore, light emitted from just about 20% of total pixel area is directed toward observers. In other words, the back surface emitting AM-OLED has an aperture ratio of about 20%. Such a structure makes it difficult to achieve a high luminance. More current has to be applied, in order to increase brightness in a low aperture ratio device. This increases power consumption, which is unsuitable for portable display devices.

In order to overcome such problems, the AM-OLED should have a front surface emitting structure that emits light through the front surface. In the front surface emitting AM-OLED, the lower electrode should be made of an opaque material, and the upper electrode should be made of a transparent material.

However, if the transparent upper electrode is formed on the organic EL region, the relatively high temperature required for depositing the transparent upper electrode damages the organic EL region. Therefore, it is very difficult to produce a front surface emitting AM-OLED.

U.S. Pat. No. 6,046,543 to Bulovic, et al., entitled "high reliability, high efficiency, integratable organic light emitting devices and methods of producing same," describes a method of forming a transparent cathode electrode in order to implement the front surface emitting AM-OLED. U.S. Pat. No. 5,981,306 to Burrows, et al., entitled "method for depositing indium tin oxide layers in organic light emitting devices," describes a method of forming indium tin oxide (ITO) at a very low depositing rate in order to implement the front surface emitting AM-OLED. U.S. Pat. No. 5,739,545 to Guha, et al., entitled "organic light emitting diodes having transparent cathode structures," describes the front surface emitting AM-OLED implemented using a transparent cathode electrode.

However, such methods are not easy to implement, and demand a long processing time. In addition, it is difficult to control device characteristics. Besides, in the conventional AM-OLED, as described above, the metal can is used to protect the organic EL region from oxygen and moisture, thus increasing the weight and volume of the AM-OLED as a whole.

SUMMARY OF THE INVENTION

To overcome the problems described above, preferred embodiments of the present invention provide an organic EL device having a high aperture ratio, a high brightness, and consuming less power.

It is another object of the present invention to provide an organic EL device having a high reliability and a light-weight.

In order to achieve the above object, the preferred embodiment of the present invention provides an organic EL device, comprising a thin film transistor (TFT) array substrate that includes a first insulating substrate, a TFT formed on the first insulating substrate, a planarization layer formed on the TFT, a conductive interface pad connected to the TFT and deposited on the planarization layer, and a capacitor formed on the first insulating substrate. It also has an organic EL substrate that includes a second insulating substrate, a transparent electrode, an organic EL layer, and a metal electrode electrically connected to the conductive interface pad on the thin film transistor array substrate by a conductive bonding agent.

The conductive bonding agent is also used between the organic EL substrate and the thin film transistor array substrate.

The organic EL substrate further includes a protection film that prevents external oxygen and moisture.

The protection film is formed by depositing a SiNx layer and a $SiO_2$ at least once.

The TFT array substrate and the organic EL substrate are sealed by a UV-curable agent.

The conductive bonding agent is an anisotropic conductive film (ACF).

The anisotropic conductive film prevents external oxygen and moisture.

Further, the other embodiment of the present invention provides an organic EL device, comprising a thin film transistor (TFT) array substrate that includes a first insulating substrate, a TFT formed on the first insulating substrate, a planarization layer formed on the TFT, a conductive interface pad connected to the TFT and deposited on the planarization layer, a conductive bump pad formed on the conductive interface pad, and a capacitor formed on the first insulating substrate and an organic EL substrate that includes a second insulating substrate, a transparent electrode, an organic EL layer, and a metal electrode connected to the conductive bump pad on the thin film transistor array substrate.

The conductive bump pad is directly connected to the metal electrode. It is electrically coupled to the metal electrode by conductive bonding agent.

The conductive bonding agent is further included between the organic EL substrate and the thin film transistor array substrate.

The conductive bonding agent is an anisotropic conductive film (ACF). The anisotropic conductive film prevents external oxygen and moisture.

Further, the preferred embodiment of the present invention provides an organic EL device, comprising a thin film transistor (TFT) array substrate that includes a first insulating substrate, a TFT formed on the first insulating substrate, a planarization layer formed on the TFT, a conductive interface pad connected to the TFT and deposited on the planarization layer, and a capacitor formed on the first insulating substrate, and an organic EL substrate that includes a second insulating substrate, a patterned transparent electrode, an insulating layer deposited on both ends of the patterned transparent electrode, insulating the adjacent patterned transparent electrodes and defining a pixel region, respectively, an organic EL layer deposited on the patterned transparent electrode, and a metal electrode electrically connected to the conductive interface pad on the thin film transistor array substrate by a conductive bonding agent.

Also, the preferred embodiment of the present invention provides an organic EL device comprising a thin film transistor (TFT) array substrate that includes a first insulating substrate, a TFT formed on the first insulating substrate, a planarization layer formed on the TFT, a conductive interface pad connected to the TFT and deposited on the planarization layer, a conductive bump pad formed on the conductive interface pad, and a capacitor formed on the first insulating substrate, and an organic EL substrate that includes a second insulating substrate, a transparent electrode, a patterned transparent electrode, an insulating layer deposited on both ends of the patterned transparent electrode, insulating the adjacent patterned transparent electrodes and defining a pixel region, respectively, an organic EL layer deposited on the patterned transparent electrode, an organic EL layer, and a metal electrode connected to the is conductive bump pad on the thin film transistor array substrate.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts.

DETAILED DESCRIPTION OF PREFERRED EMBODIMENTS

Reference will now be made in detail to preferred embodiments of the present invention, example of which is illustrated in the accompanying drawings.

A configuration of an organic EL device according to the preferred embodiment of the present invention will be explained through a process of manufacturing the organic EL device. In order to manufacture the organic EL device, a TFT array substrate 500 in FIG. 15 supplying a display power to the organic EL region and an organic EL substrate 600 in FIG. 20 including an organic EL region are respectively manufactured and then are assembled.

First, a process for manufacturing the TFT array substrate 500 according to a first preferred embodiment of the present invention is explained with reference to FIGS. 1 through 16, and a process for manufacturing the organic EL substrate 600 according to the first preferred embodiment of the present invention is explained with reference to FIGS. 17 through 20. Thereafter, a process of assembling the TFT array substrate and the organic EL substrate according to the first preferred embodiment of the present invention is explained with reference to FIGS. 21 and 23.

In FIGS. 1, 3, 5, 7, 9, 11, 13, 15, left portions show cross-sectional views taken long line A—A of FIGS. 2, 4, 6, 8, 10, 12, 14, 16, right portions show cross-sectional views taken long line B—B of FIGS. 2, 4, 6, 8, 10, 12, 14, 16, respectively.

Figure 1:
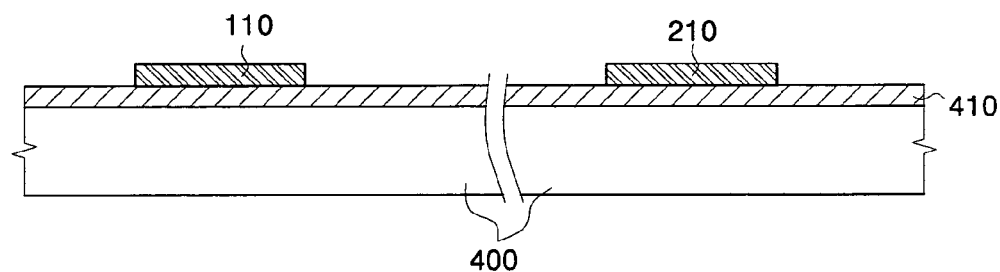
FIGS. 1, 2, 3, 4, 5, 6, 7, 8, 9, 10, 11, 12, 13, 14, 15 and 16 are processing views illustrating a process of manufacturing a thin film transistor (TFT) array substrate according to a first preferred embodiment of the present invention.
Figure 21:
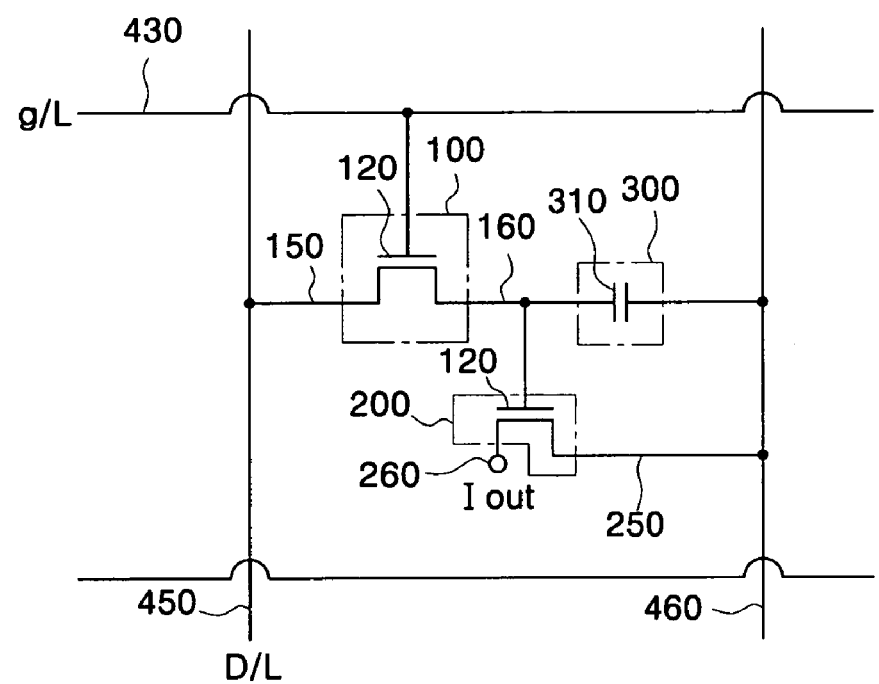
FIG. 21 is a circuit diagram illustrating an equivalent circuit of one pixel of the organic EL device according to the preferred embodiments of the present invention.

Referring to FIG. 21, in order to form one unit pixel on the TFT array substrate 500 on a base substrate 400 in FIG. 1, two thin film transistors (TFTs) 100 and 200, a storage capacitor 300, gate lines 430 supplying a bias voltage to turn on the TFTs, data lines 450 to which an image signal encoded from an image signal processing apparatus (e.g., VGA card), and common power lines 460 are formed.

Figure 2:
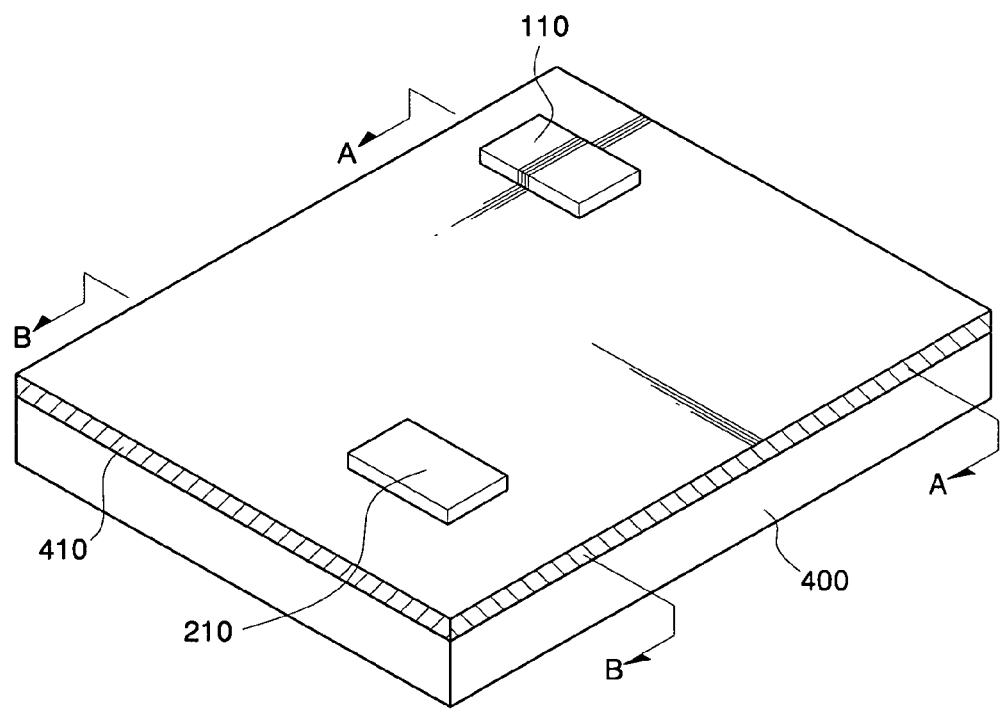

First, in order to manufacture the first TFT 100 and the second TFT 200, as shown in FIGS. 1 and 2, a buffer layer 410 is formed on the whole surface of the base substrate or the first insulating substrate 400 to a predetermined thickness. The buffer layer 410 serves to protect the first TFT 100, the second TFT 200, and the storage capacitor 300 that will be formed in a subsequent process, from ions coming from the base substrate 400. For example, when the base substrate 400 is made of glass, the buffer layer 410 prevents that ions such as $Na^+$ and $K^+$ of glass are diffused into the first TFT 100, the second TFT 200, and the storage capacitor 300.

An amorphous silicon layer is deposited on the buffer layer 410. Even though not shown, the amorphous silicon layer is subject to an annealing process, for example, a laser annealing, to form a polycrystalline silicon layer. The polycrystalline silicon layer is formed because the polycrystalline silicon layer has a superior electron mobility to the amorphous silicon layer. Instead of depositing and annealing the amorphous silicon layer to form the polycrystalline silicon layer, the polycrystalline silicon layer may be deposited directly on the buffer layer 410 through, for example, a chemical vapor deposition (CVD) technique. Therefore, the polycrystalline silicon layer is patterned into a first semiconductor layer 110 and a second semiconductor layer 210 of an island shape.

In more detail, a photoresist is coated on the polycrystalline silicon layer using, for example, a spin coating technique, and is subject to a light exposure to form photoresist patterns on a location corresponding to the semiconductor layers 110 and 210. Using the photoresist patterns as a mask, the polycrystalline silicon layer is wet- or dry-etched to form the first semiconductor layer 110 and the second semiconductor layer 210. The photoresist patterns are removed.

Figure 3:
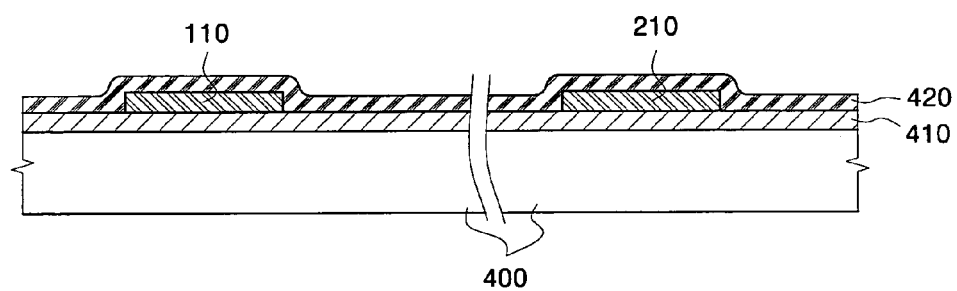
Figure 4:
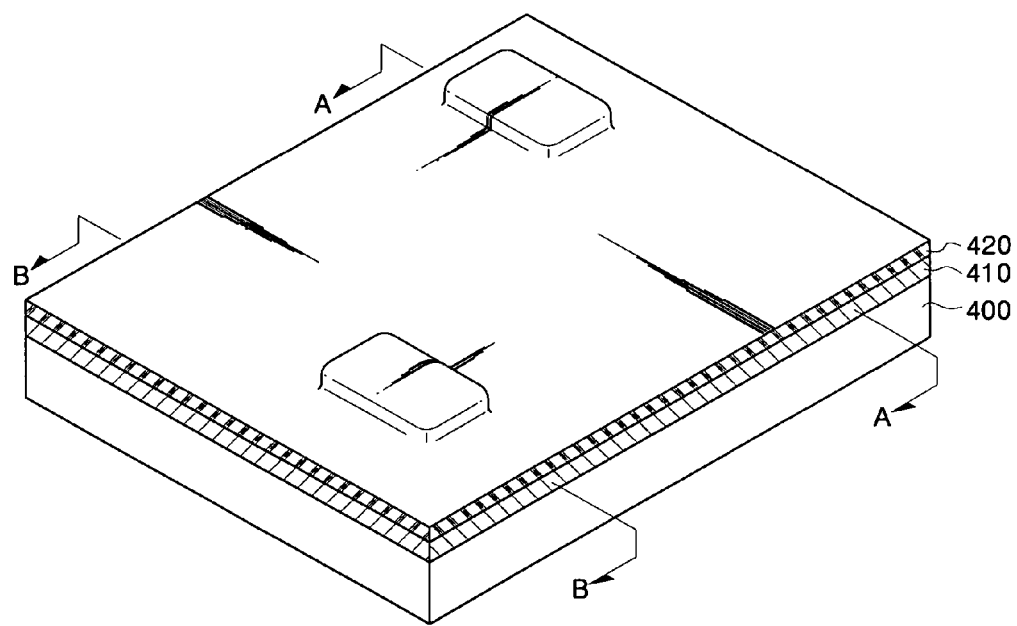

Subsequently, as shown in FIGS. 3 and 4, a gate insulating layer 420 is formed over the whole surface of the base substrate to cover the first semiconductor layer 110 and the second semiconductor layer 210. The gate insulating layer 420 serves to insulate the semiconductor layers 110 and 210, respectively, from first and second gate electrodes of the first and second TFTs 100 and 200 that will be formed in a subsequent process.

Figure 5:
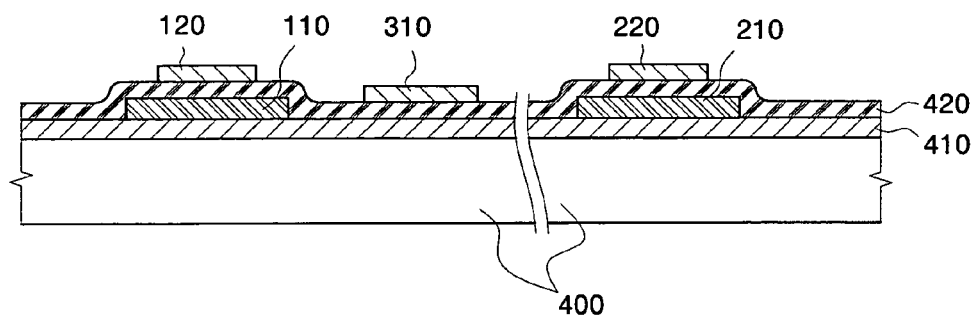
Figure 6:
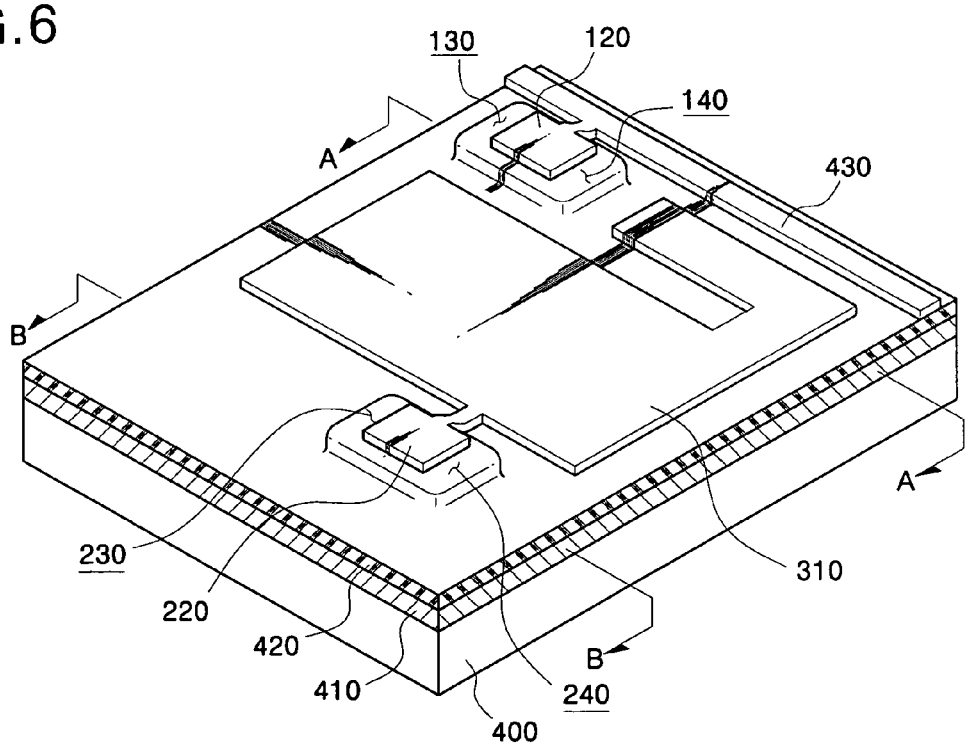
Figure 19:
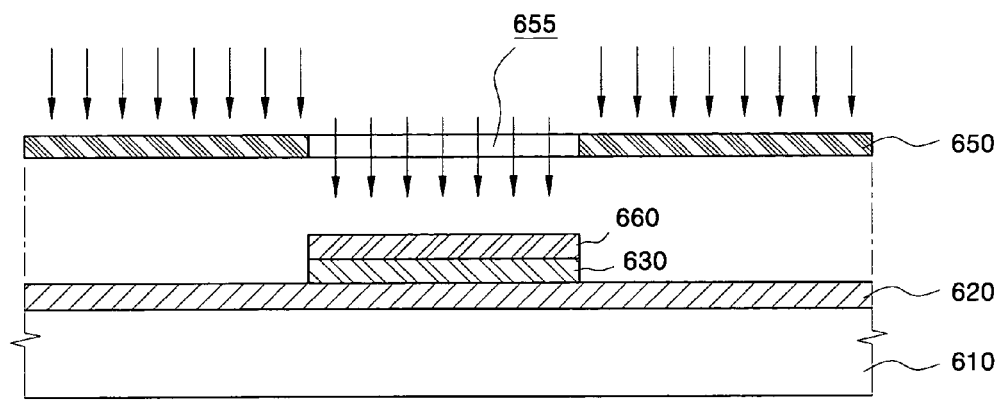

Thereafter, a first metal layer is deposited on the gate insulating layer 420 using, for example, a sputtering technique to a predetermined thickness. The first metal layer comprises a metal such as aluminum (Al) and aluminum-neodymium alloy (Al:Nd). As shown in FIGS. 5, 6 and 19 the first metal layer is patterned to form a first gate electrode 120 of the first TFT 100, a second gate electrode 220 of the second TFT 200, a first capacitor electrode 310 of the storage capacitor 300, and a gate line 430. Subsequently, an n-type or a p-type impurity is ion-implanted into the semiconductor layers 110 and 220 to form a first source region 130 and a first drain region 140 of the first TFT 100 and a second source region 240 and a second drain region 230 of the second TFT 200.

In more detail, on a portion of the gate insulating layer 420 corresponding to the first semiconductor layer 110, the first gate electrode 120 having an area size smaller than the first semiconductor layer 110 is formed. The gate line 430 is arranged in a transverse direction spaced apart from the first semiconductor layer 110 and is connected to the first gate electrode 120. At this point, the first semiconductor layer 110 includes the source region 130 and the drain region 140, respectively, formed on both end portions thereof. The first capacitor electrode 310 is formed between the first gate electrode 120 and the second gate electrode 220 in such a way that it is spaced apart from the drain region 140 of the first semiconductor layer 110 and is connected to the second gate electrode 220. On a portion of the gate insulating layer 420 corresponding to the second semiconductor layer 210, the second gate electrode 220 with an area smaller than the second semiconductor layer 210 is formed. At this point, the second semiconductor layer 210 includes the drain region 230 and the source region 240, respectively, formed on both end portions thereof.

Figure 7:
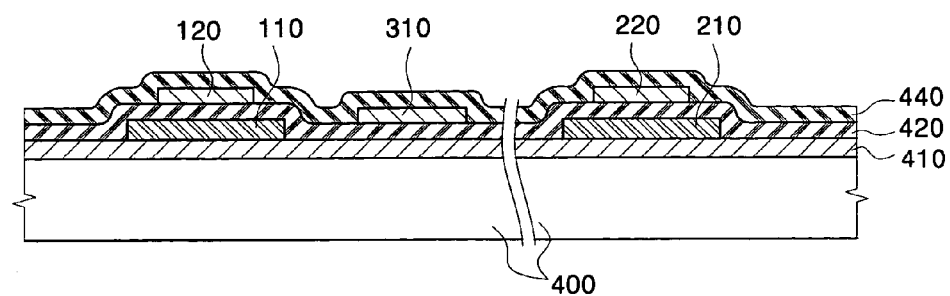
Figure 8:
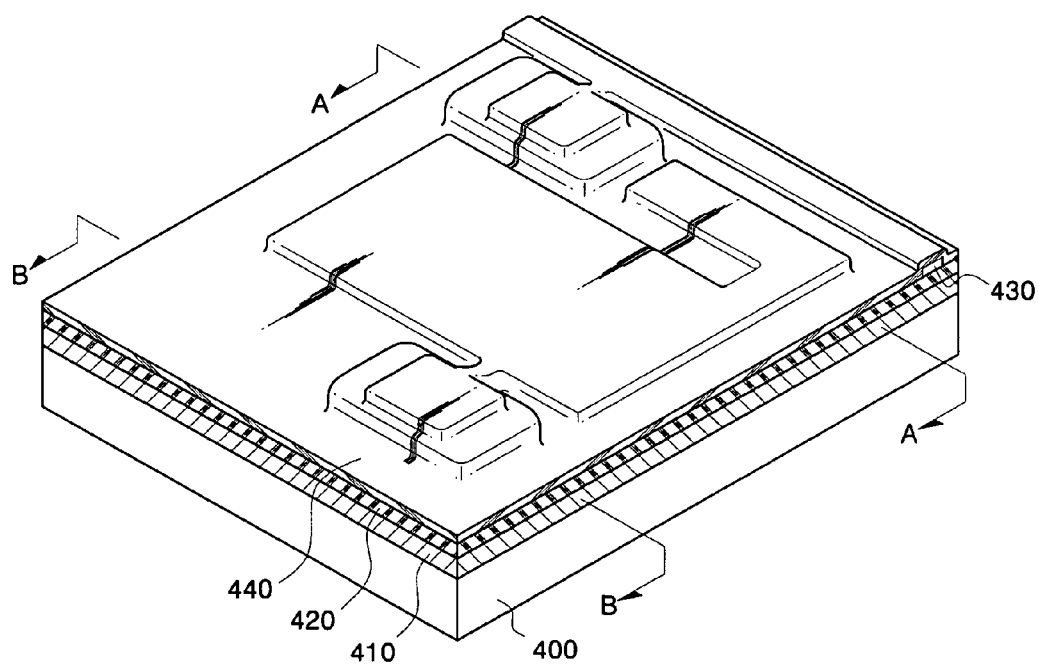

As shown in FIGS. 7 and 8, an interlayer insulator 440 is formed over the whole surface of the base substrate 400 to cover the first gate electrode 120 and the second gate electrode 220, and the first capacitor electrode 310. The interlayer insulator 440 serves to insulate the first gate electrode 120 and the second gate electrode 220 from first source and drain electrodes 182 and 184 and second source and drain electrodes 282 and 284, which will be formed in a subsequent process. A portion of the interlayer insulator 440 corresponding to the first capacitor electrode 310 serves as a dielectric layer of the storage capacitor 300.

Figure 9:
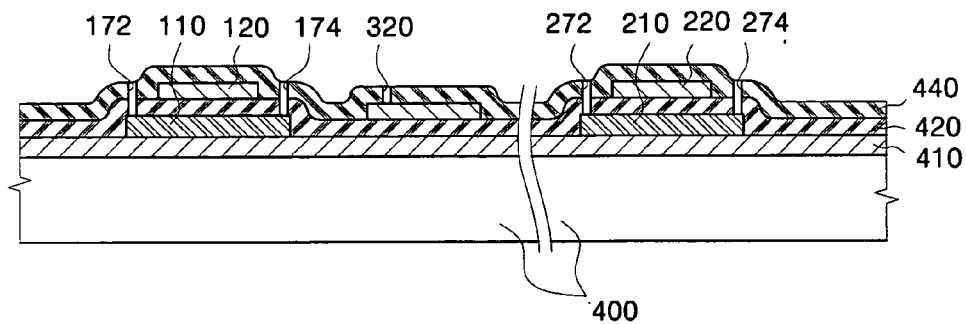
Figure 10:
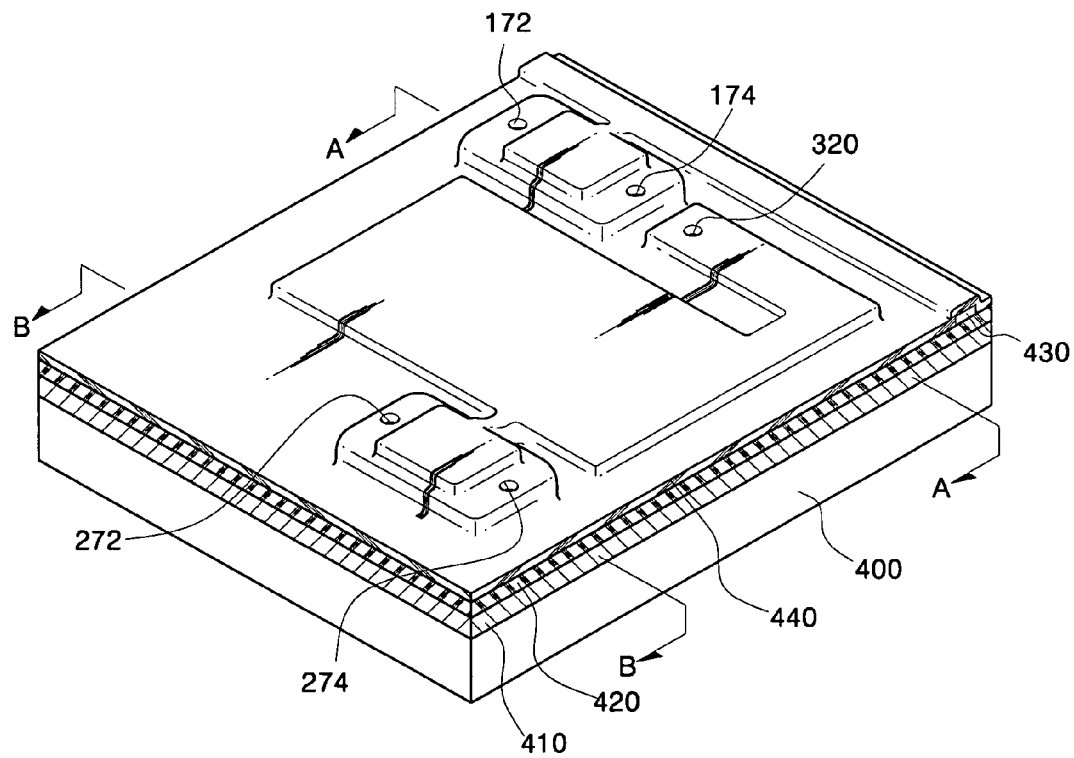

As shown in FIGS. 9 and 10, the interlayer insulator 440 includes a first source contact hole 172 and a first drain contact hole 174 and a second drain contact hole 272 and a second source contact hole 274. The first source and drain contact holes 172 and 174 are formed at locations corresponding to the first source and drain regions 130 and 140, and the second drain and source contact holes 272 and 274 are formed at locations corresponding to the second drain and source regions 230 and 240. The interlayer insulator 440 further includes a capacitor contact hole 320 at a location corresponding to a portion of the first capacitor electrode 310 adjacent to the first drain region 140.

Figure 11:
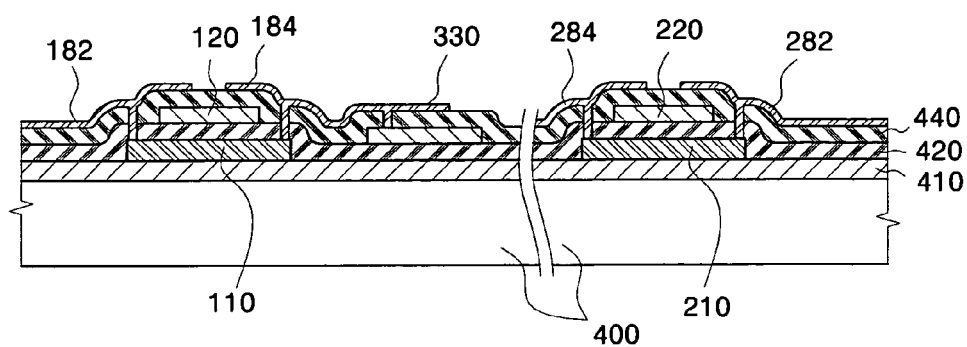
Figure 12:
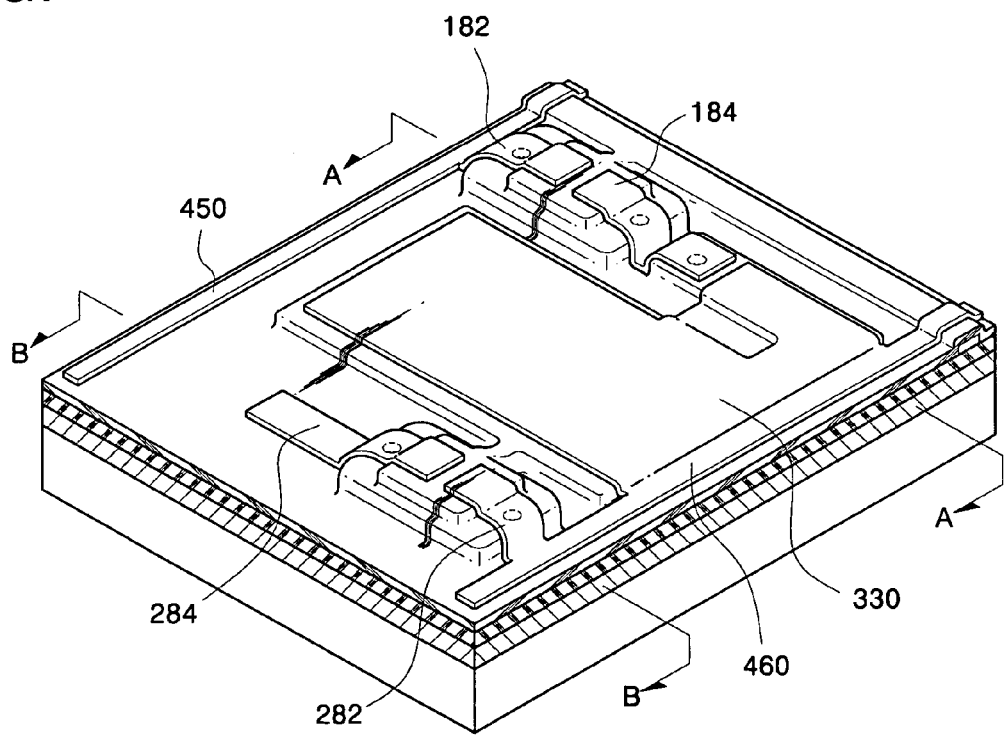

Subsequently, a second metal layer is deposited on the interlayer insulator 440 using, for example, a sputtering technique. As shown in FIGS. 11, 12 and 19, the second metal layer is patterned to form a first source electrode 182 and a second drain electrode 184 of the first TFT 100, a second source electrode 282 and a second drain electrode 284 of the second TFT 200, a second capacitor electrode 330 of the storage capacitor 300, a data line 450, and a common power line 460.

The data line 450 is arranged in a perpendicular direction to the gate line 430 and is connected to one end portion of the first source electrode 182. The other end portion of the first source electrode 182 overlaps over one end portion of the first gate electrode 120. The first source electrode 182 is electrically connected to the first source region 130 through first source contact hole 172. One end portion of the first drain electrode 184 overlaps over the other end portion of the first gate electrode 120, and the other end portion of the first drain electrode 184 overlaps over an end portion of the first capacitor electrode 310. The first drain electrode 184 is electrically connected to the first drain region 140 and the first capacitor electrode 310, respectively, through the first drain contact hole 174 and the capacitor contact hole 320. The common power line 460 is arranged in a perpendicular direction to the gate line 430 and is opposite to the data line 450. The second capacitor electrode 330 is connected to the common power line 460 and overlaps the first capacitor electrode 310. The second drain electrode 284 has one end portion overlapping over one end portion of the second gate electrode 220, and second source electrode 282 has one end portion overlapping over the other end portion of the second gate electrode 220 and the other end portion extending from the common power line 460. The second drain electrode 284 is electrically connected to the second drain region 230 through the second drain contact hole 272, and the second source electrode 282 is electrically connected to the second source region 240 through the second source contact hole 274.

Figure 13:
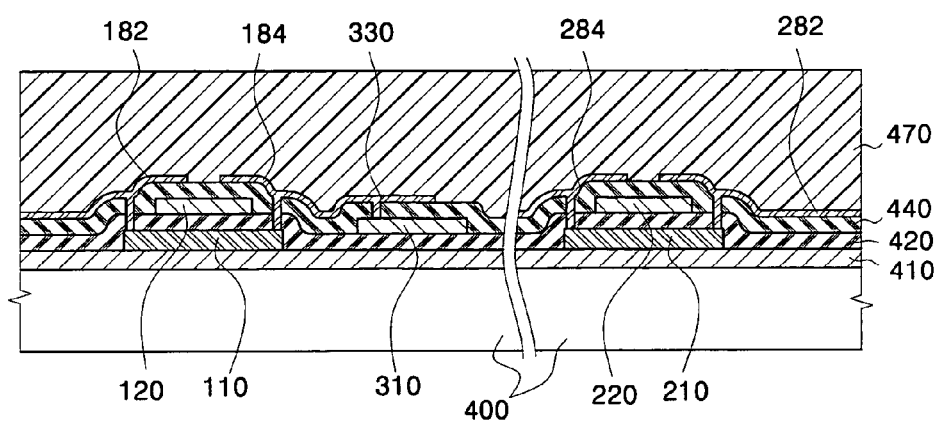
Figure 14:
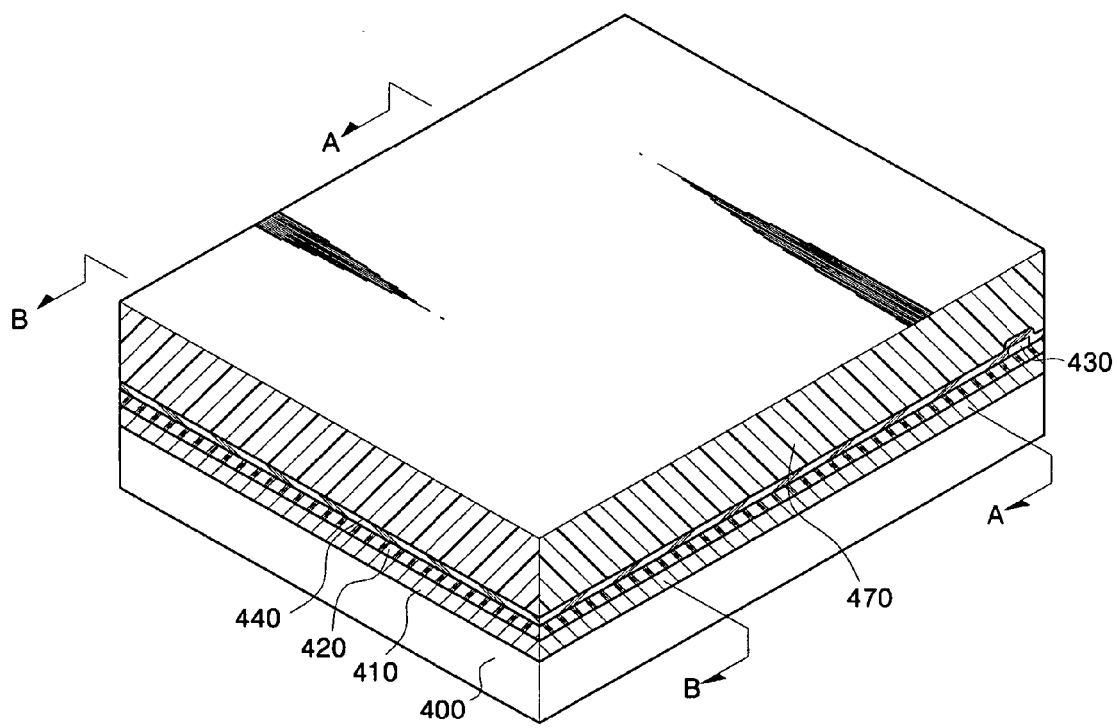

Subsequently, as shown in FIGS. 13 and 14, a planarization film 470 is formed over the whole surface of the base substrate 400 to cover the first source electrode 182 and the first drain electrode 184, the second source electrode 282 and the second drain electrode 284, the second capacitor electrode 330, the data line 450, and the common power line 460. The planarization film 470 includes a third drain contact hole 475 (see FIG. 15) at a location corresponding to a portion of the second drain electrode 284.

Figure 15:
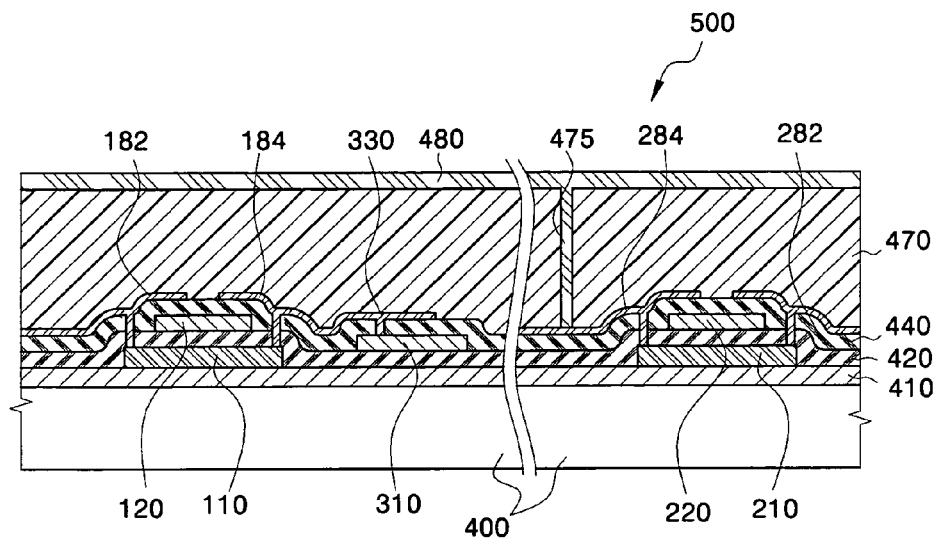
Figure 16:
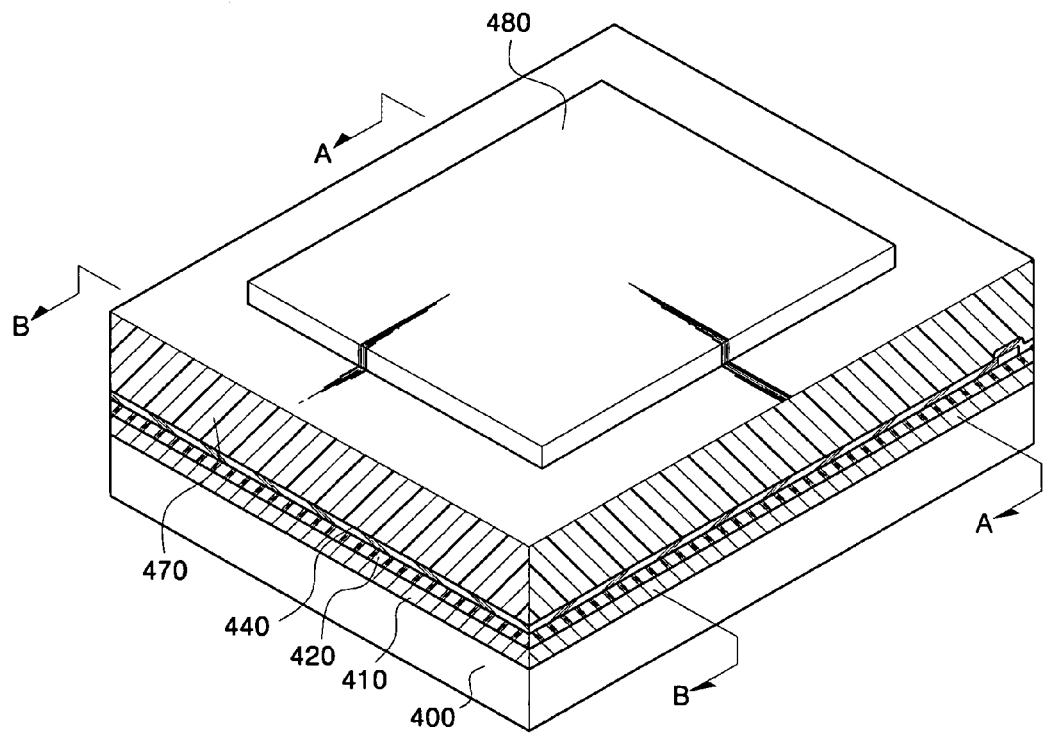

Finally, as shown in FIGS. 15 and 16, a conductive material layer is deposited on the planarization film 470 and is patterned to from an interface pad 480. The interface pad 480 is electrically connected to the second drain electrode 284 through the third drain contact hole 475. This completes the TFT array substrate 500.

The manufactured TFT array substrate 500 is then assembled with the organic EL substrate 600.

FIGS. 17, 18, 19, and 20 are cross-sectional views illustrating a process for manufacturing the organic EL substrate 600 according to the first preferred embodiment of the present invention.

Figure 17:
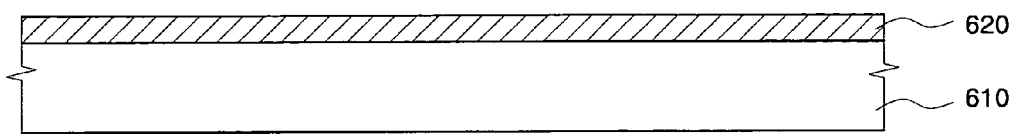
FIGS. 17, 18, 19, and 20 are cross-sectional views illustrating a process of manufacturing an organic EL substrate according to the first preferred embodiment of the present invention.

First, as shown in FIG. 17, a transparent electrode is formed on a transparent substrate 610 to a predetermined thickness. The transparent electrode 620 is made of a transparent material such as indium tin oxide (ITO) or indium zinc oxide (IZO).

Figure 18:
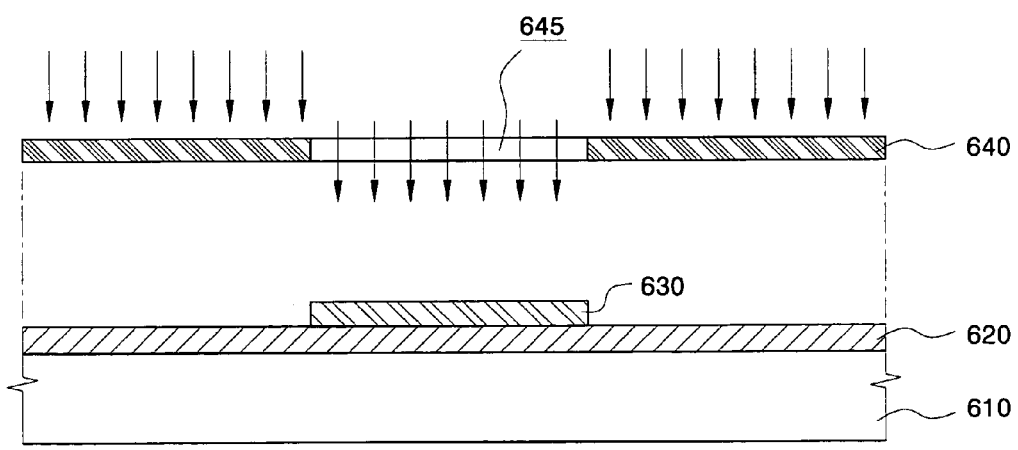

Thereafter, as shown in FIG. 18, an organic EL layer 630 is formed on the transparent electrode 620 using a shadow mask 640. The organic EL layer 630 includes one of a red organic EL material, a green organic EL material and a blue organic EL material. The shadow mask 640 includes an opening portion 645. The opening portion 645 is formed at a location corresponding to the organic EL layer 630.

Subsequently, as shown in FIG. 19, a conductive metal layer is deposited on the organic EL layer 630 through the opening portion 655 of the shadow mask 650 to form a metal electrode 660.

Figure 20:
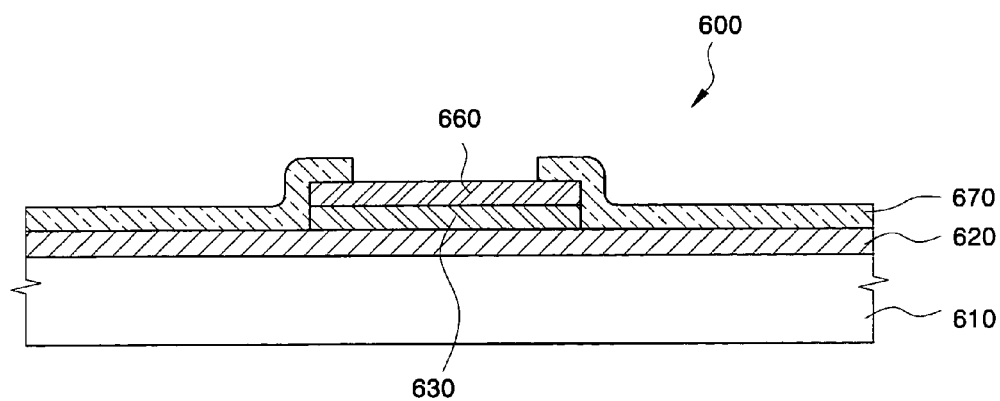

As shown in FIG. 20, a protection film 670 is formed to overlap both end portions of the metal electrode 660 using a photolithography technique, exposing an upper surface of the metal electrode 660.

Figure 22:
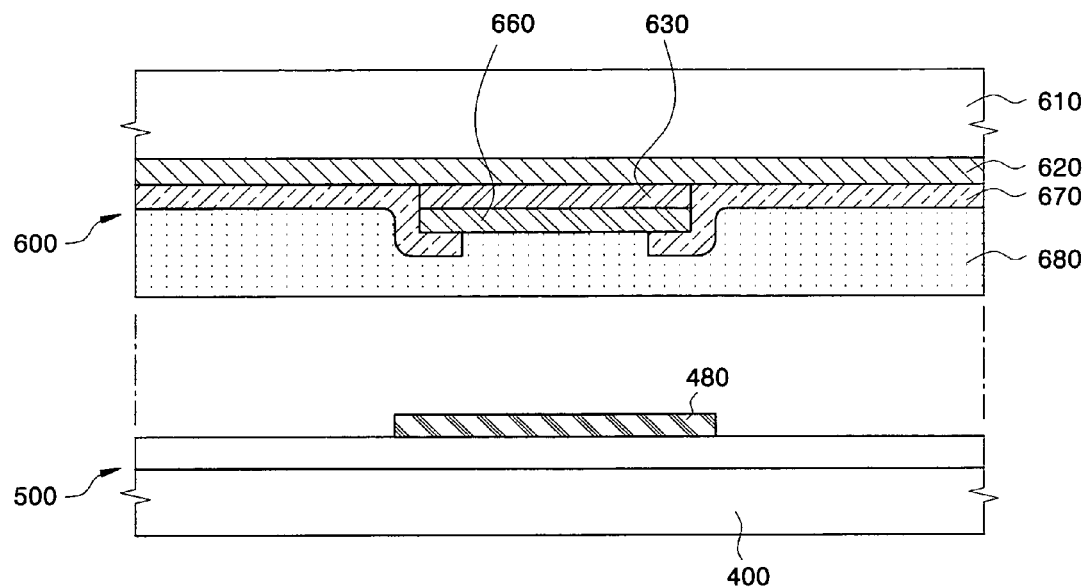
FIGS. 22 and 23 are cross-sectional views illustrating a process of assembling the TFT array substrate and the organic EL substrate according to the first preferred embodiment of the present invention.

Next, as shown in FIG. 22, an anisotropic conductive film (ACF) 680 is formed over the whole surface of the transparent substrate 610 to a predetermined thickness. The anisotropic conductive film 680 has both adhesive force and conductivity. In other words, the anisotropic conductive film 680 is configured in a way that conductive particles are finely arranged among adhesive materials. Therefore, when the anisotropic conductive film 680 is pressurized, electrons can flow through the conductive particles. Such an anisotropic conductive film 680 is used to enable an electric current to flow from one conductive material to another conductive material by an attachment method other than a soldering method.

The organic EL substrate 600 on which the anisotropic conductive film 680 is formed is aligned with the TFT array substrate 500 to face the anisotropic conductive film 680 of the organic EL substrate 600 toward the conductive interface pad 480 of the TFT array substrate 500.

Figure 23:
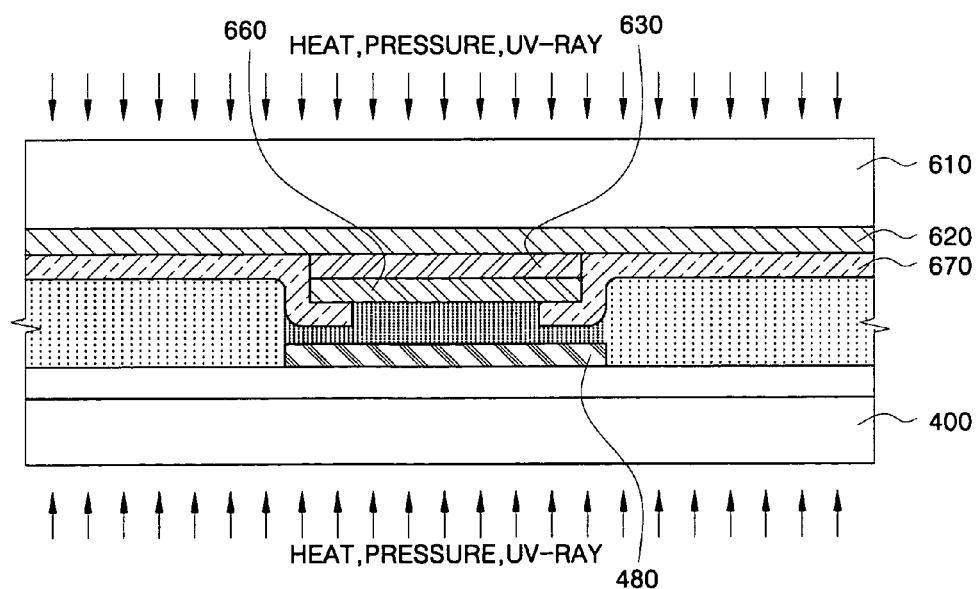

Then, as shown in FIG. 23, the TFT array substrate 500 and the organic EL substrate 600 are heated, pressurized, and UV-treated to be glued to each other. As a result, not only the TFT array substrate 500 and the organic EL substrate 600 are firmly stuck to each other, but also electrons can travel from the conductive interface pad 480 to the metal electrode 660.

A portion of the anisotropic conductive film 680 where electrons do not move serves to shield the organic EL device from oxygen and moisture. That is, the portion of the anisotropic conductive film 680 where a movement of electrons does not occur plays the same role as the conventional metal can.

Figure 24:
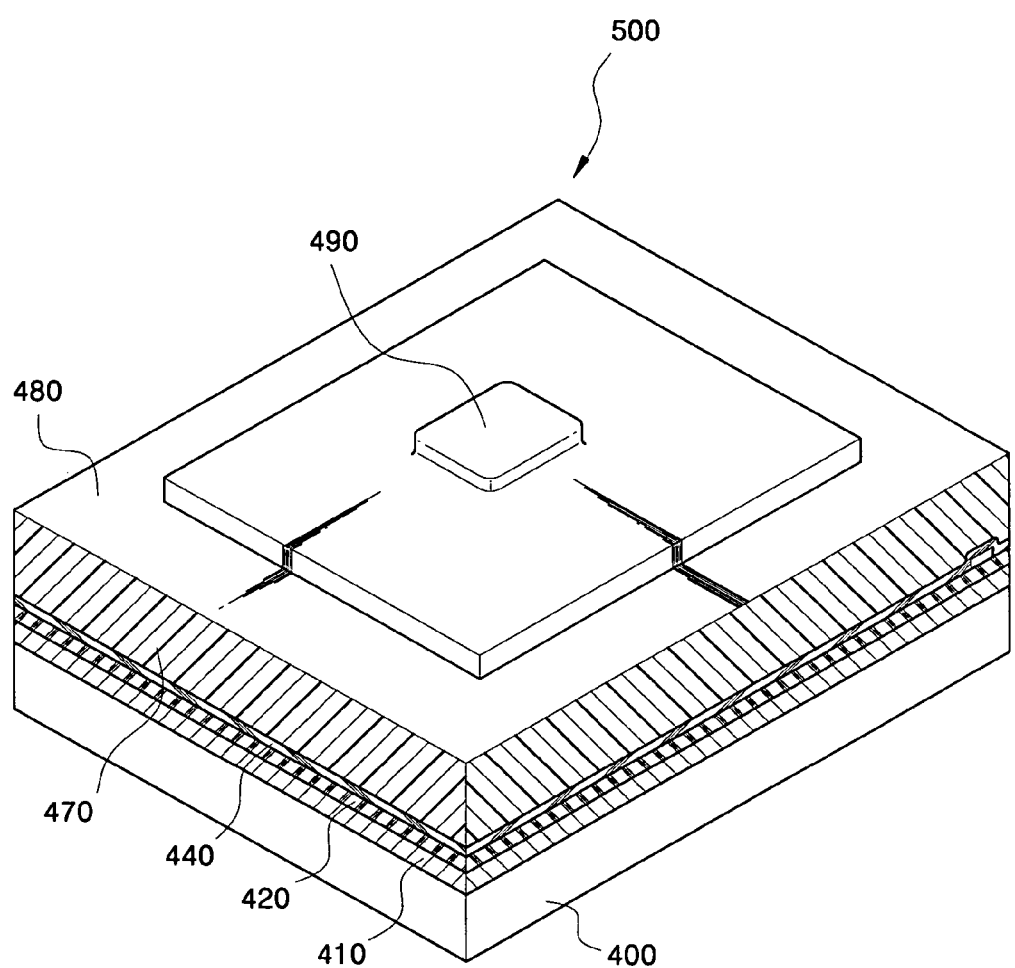
FIG. 24 is a perspective view illustrating a TFT array substrate according to a second preferred embodiment of the present invention.

FIG. 24 is a perspective view illustrating a TFT array substrate 500 according to a second preferred embodiment of the present invention. The TFT array substrate 500 includes a bump pad 490 in addition to a configuration of the TFT array substrate 500 of FIG. 16. At this point, the interface pad 480 is made of a conductive resin, a metal alloy, or a conductive metal such as Al, Pd, Au, Ti, TiW, NiCr, Cr, Nd, AlNd, and Pt, and has a thickness of about 300 Å to about 20000 Å. The bump pad 490 is formed using an electroplating technique, a non-electrolysis plating technique, a sputtering technique, a spin coating technique, or a chemical vapor deposition (CVD) technique. The bump pad 490 comprises Ni, Au, PbSn, In, or polymer.

The TFT array substrate 500 of FIG. 24 is assembled with an organic EL substrate 600 in FIG. 20.

Figure 25:
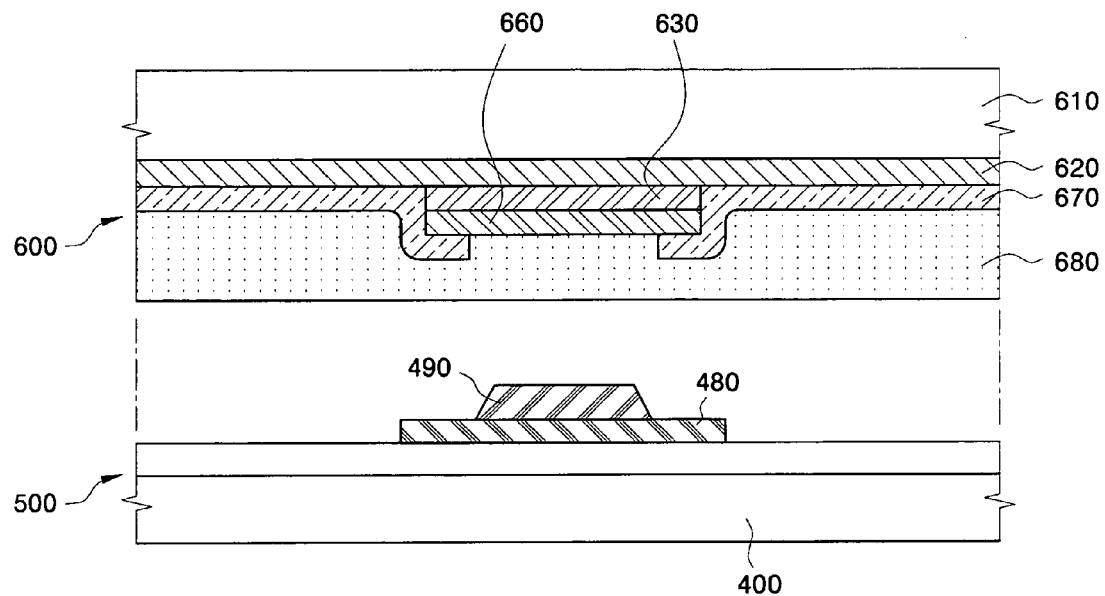
FIGS. 25 and 26 are cross-sectional views illustrating a process of assembling the TFT array substrate and the organic EL substrate according to the second preferred embodiment of the present invention.

Next, as shown in FIG. 25, an anisotropic conductive film (ACF) 680 is formed over the whole surface of the transparent substrate 610 to a predetermined thickness. The anisotropic conductive film 680 has both adhesive force and conductivity. In other words, the anisotropic conductive film 680 is configured in a way that conductive particles are finely arranged among adhesive materials. Therefore, when the anisotropic conductive film 680 is pressurized, electrons can flow through the conductive particles. Such an anisotropic conductive film 680 is used to enable an electric current to flow from one conductive material to another conductive material by an attachment method other than a soldering method.

The organic EL substrate 600 on which the anisotropic conductive film 680 is formed is aligned with the TFT array substrate 500 to face the anisotropic conductive film 680 of the organic EL substrate 600 toward the bump pad 490 of the TFT array substrate 500.

Figure 26:
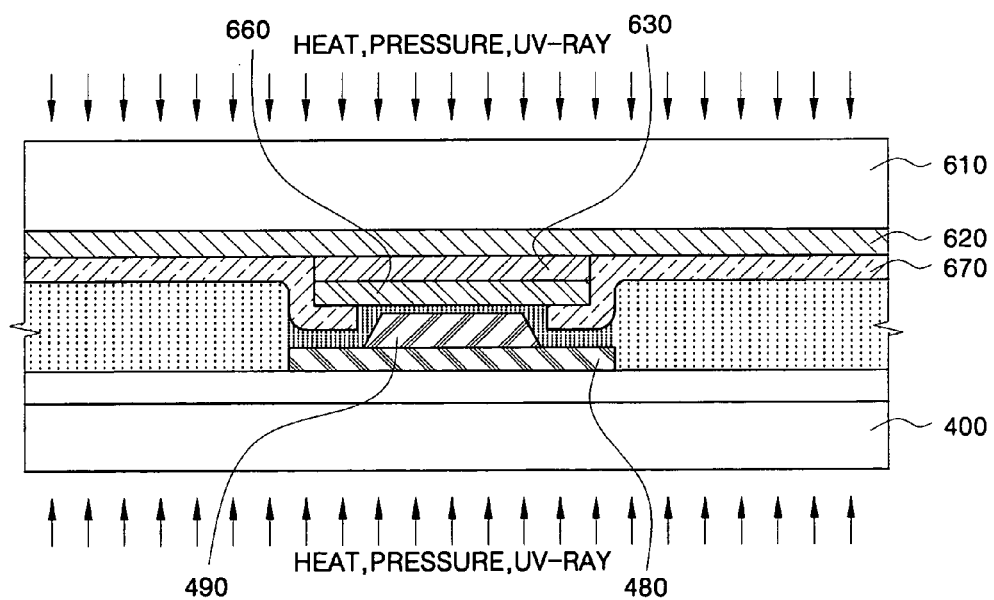

Then, as shown in FIG. 26, the TFT array substrate 500 and the organic EL substrate 600 are heated, pressurized, and UV-treated to be glued to each other. As a result, not only the TFT array substrate 500 and the organic EL substrate 600 are firmly stuck to each other, but also electrons can travel from the bump pad 490 to the metal electrode 660.

A portion of the anisotropic conductive film 680 where electrons do not move serves to shield the organic EL device from oxygen and moisture. That is, the portion of the anisotropic conductive film 680 where a movement of electrons does not occur plays the same role as the conventional metal can.

When the TFT array substrate 500 and the organic EL substrate 600 are assembled using the anisotropic conductive film 680, a much stronger adhesive force can be obtained than using the UV-curable agent 960. In addition, electric characteristics can be improved by reducing such problems as a signal delay caused by a contact resistance between the interface pad 480 and the metal electrode 950.

As another example, a solder may be coated on the bump pad 490 and then melted to solder the bump pad 490 of the TFT array substrate 500 and the metal electrode 760 of the organic EL substrate 700.

Figure 27:
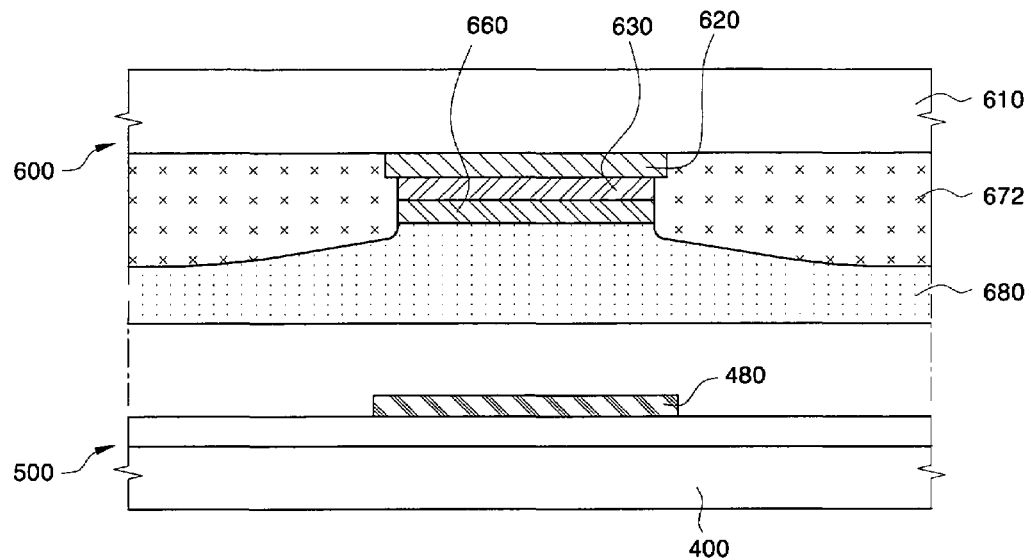
FIGS. 27 and 28 are cross-sectional views illustrating a process of assembling the is TFT array substrate and the organic EL substrate according to a third preferred embodiment of the present invention.
Figure 28:
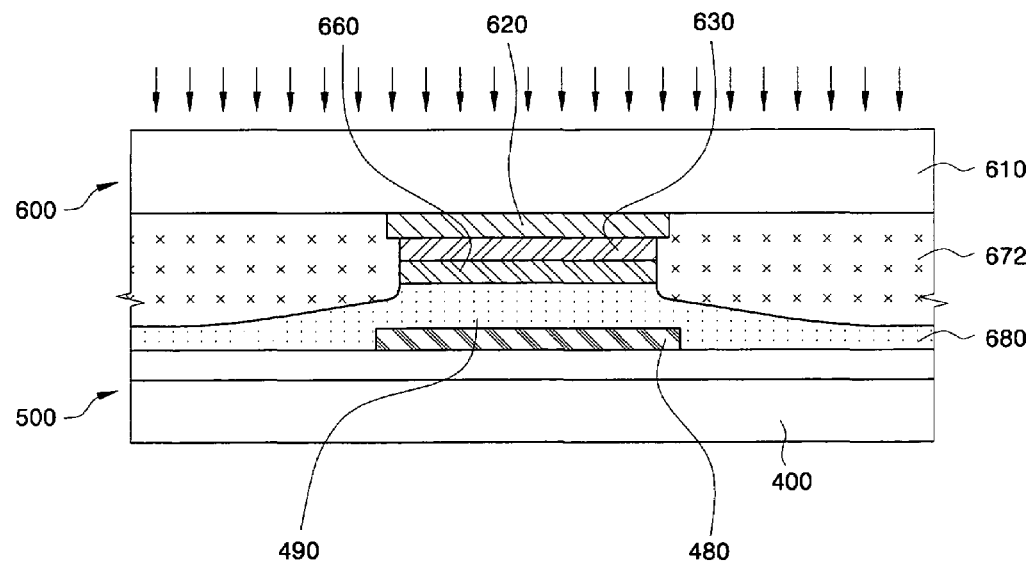

FIGS. 27 and 28 are cross-sectional views illustrating a process of assembling the TFT array substrate and the organic EL substrate according to a third preferred embodiment of the present invention.

As shown in FIG. 27, a transparent electrode is formed and patterned on a transparent substrate 610 to a predetermined thickness. The transparent electrode 620 is made of a transparent material such as indium tin oxide (ITO) or indium zinc oxide (IZO).

Thereafter, an insulating layer 672 is formed to overlap both end portions of the transparent electrode 620 using a photolithography technique, exposing an upper surface of the transparent electrode 620. The insulating layer 672 insulates the adjacent patterned transparent electrodes and defines a pixel region, respectively. The insulating layer 672 is consisted of one from the group consisting of phenol resin, polyacryl resin and polyimide resin.

Thereafter, an organic EL layer 630 is formed on the insulating layer 672 using a shadow mask 640 or LITI technique. The organic EL layer 630 includes one of a red organic EL material, a green organic EL material and a blue organic EL material.

Subsequently, a conductive metal layer is deposited on the organic EL layer 630 through the opening portion 655 of the shadow mask 650 to form a metal electrode 660.

Next, an anisotropic conductive film (ACF) 680 is formed over the whole surface of the transparent substrate 610 to a predetermined thickness. The anisotropic conductive film 680 has the same characteristics and capabilities as described above. Such an anisotropic conductive film 680 is used to enable an electric current to flow from one conductive material to another conductive material by an attachment method other than a soldering method.

The organic EL substrate 600 on which the anisotropic conductive film 680 is formed is aligned with the TFT array substrate 500 to face the anisotropic conductive film 680 of the organic EL substrate 600 toward the conductive interface pad 480 of the TFT array substrate 500.

Then, as shown in FIG. 28, the TFT array substrate 500 and the organic EL substrate 600 are heated, pressurized, and UV-treated to be glued together. As a result, not only the TFT array substrate 500 and the organic EL substrate 600 are firmly stuck to each other, but also electrons can travel from the conductive interface pad 480 to the metal electrode 660.

A portion of the anisotropic conductive film 680 where electrons do not move serves to shield the organic EL device from oxygen and moisture. That is, the portion of the anisotropic conductive film 680 where a movement of electrons does not occur plays the same role as the conventional metal can.

Figure 29:
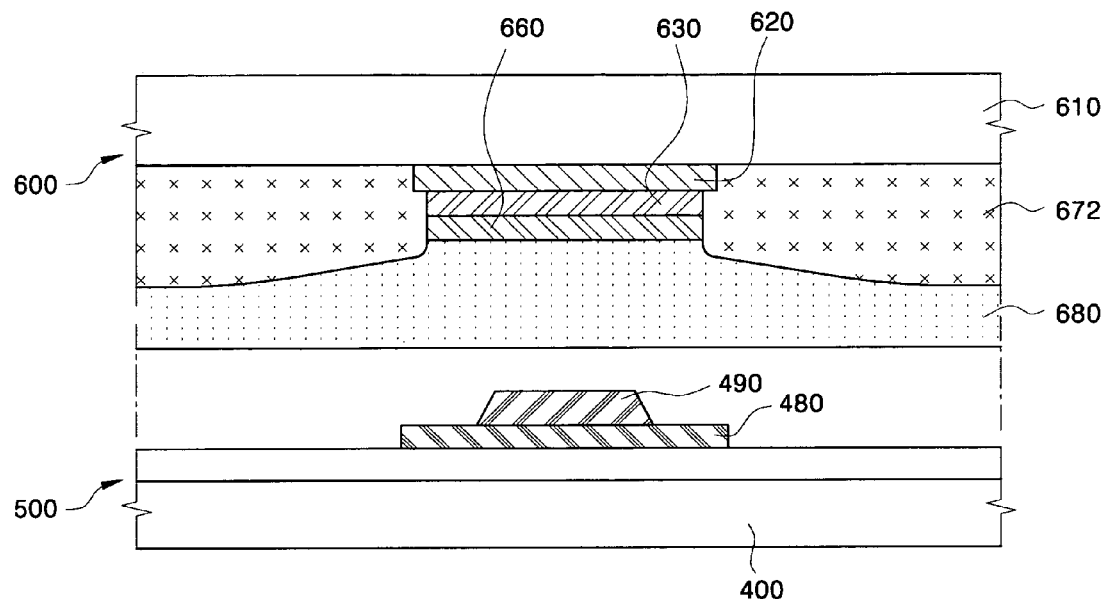
FIGS. 29 and 30 are cross-sectional views illustrating a process of assembling the TFT array substrate and the organic EL substrate according to a fourth preferred embodiment of the present invention.
Figure 30:
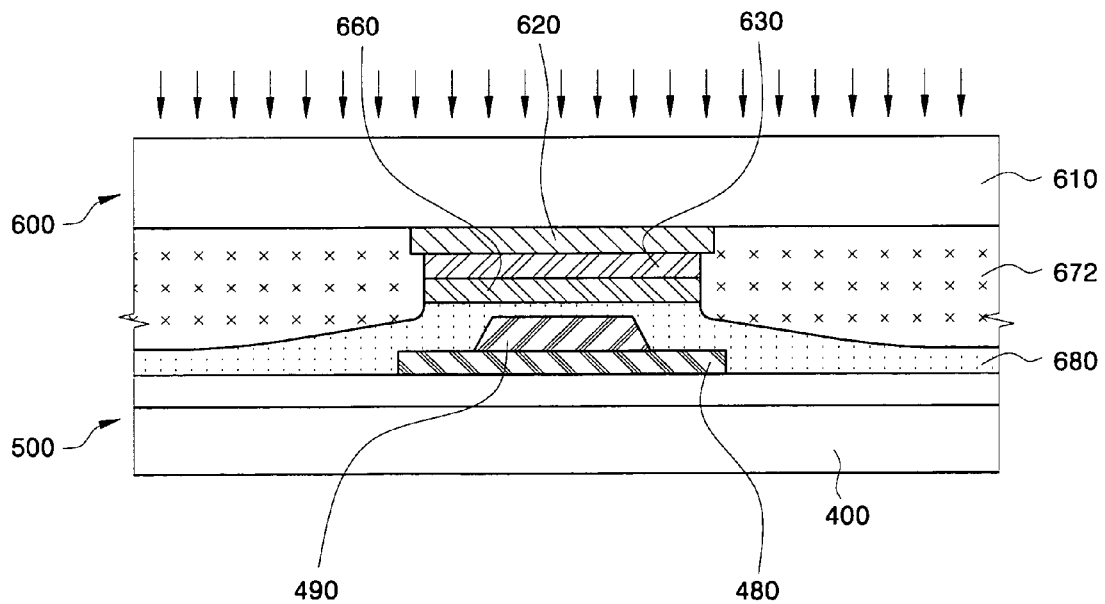

FIGS. 29 and 30 are cross-sectional views illustrating a process of assembling the TFT array substrate and the organic EL substrate according to a fourth preferred embodiment of the present invention. In the fourth preferred embodiment of the present invention, an organic EL device is the same as the third preferred embodiment except a conductive bump pad 490 in the EL substrate.

As shown in FIG. 29, the organic EL substrate 600 on which the anisotropic conductive film 680 is formed is aligned with the TFT array substrate 500 to face the anisotropic conductive film 680 of the organic EL substrate 600 toward the conductive interface pad 480 of the TFT array substrate 500.

Then, as shown in FIG. 30, the TFT array substrate 500 and the organic EL substrate 600 are heated, pressurized, and UV-treated to be glued to each other. As a result, not only the TFT array substrate 500 and the organic EL substrate 600 are firmly stuck to each other, but also electrons can travel from the conductive interface pad 480 to the metal electrode 660.

The present invention discloses a method for manufacturing the organic EL device having a high aperture ratio, a high luminance, and consuming less power. In addition, an organic EL device having a high reliability and a lightweight can be obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic EL device, comprising:
   a thin film transistor (TFT) array substrate including:
   a first insulating substrate;
   a TFT formed on the first insulating substrate;
   a planarization layer formed on the TFT;
   a conductive interface pad coupled to the TFT and deposited on the planarization layer;
   a capacitor formed on the first insulating substrate; and
   an organic EL substrate including:
   a second insulating substrate,
   a transparent electrode,
   an organic EL layer, and
   a metal electrode electrically coupled to the conductive interface pad on the thin film transistor array substrate by a conductive bonding agent, wherein the thin film transistor (TFT) array substrate further includes a conductive bump pad formed on the conductive interface pad.

2. The organic EL device of claim 1, wherein the conductive bonding agent is further formed between the organic EL substrate and the thin film transistor array substrate.

3. The organic EL device of claim 1, wherein the organic EL substrate further includes a protection film that prevents external oxygen and moisture from permeating.

4. The organic EL device according to claim 3, wherein the protection film is formed of at least one of a SiNx layer and a SiO2.

5. The organic EL device of claim 4, wherein the TFT array substrate and the organic EL substrate are sealed by a UV-curable agent.

6. The organic EL device according to claim 4, wherein the TFT array substrate and the organic EL substrate are sealed by a UV-curable agent.

7. The organic EL device of claim 1, wherein the conductive bonding agent is an anisotropic conductive film (ACF).

8. The organic EL device of claim 7, wherein the anisotropic conductive film prevents external oxygen and moisture.

9. The organic EL device of claim 1, wherein the conductive bump pad is coupled to the metal electrode.

10. The organic EL device of claim 9, wherein the organic EL substrate is coupled to the thin film transistor array substrate through the conductive bonding agent.

11. The organic EL device of claim 10, wherein the conductive bonding agent is an anisotropic conductive film (ACF).

12. The organic EL device of claim 11, wherein the anisotropic conductive film prevents external oxygen and moisture.

13. The organic EL device of claim 1, wherein the organic EL substrate further includes:
   an insulating layer deposited around the transparent electrode.

14. The organic EL device of claim 13, wherein the insulating layer is consisted of one from the group consisting of phenol resin, polyacryl resin and polyimide resin.

15. The organic EL device of claim 1, wherein the organic EL substrate further includes:
   an insulating layer deposited around the transparent electrode.

16. The organic EL device of claim 15, wherein the insulating layer is consisted of one from the group consisting of phenol resin, polyacryl resin and polyimide resin.

17. The organic EL device of claim 16, wherein the conductive bump pad is coupled to the metal electrode.

18. The organic EL device of claim 17, wherein the organic EL substrate is coupled to the thin film transistor array substrate through the conductive bonding agent.

* * * * *